(12) United States Patent
Sakakura

(10) Patent No.: US 7,438,576 B2
(45) Date of Patent: Oct. 21, 2008

(54) CONNECTOR FOR USE IN SUBSTRATE

(75) Inventor: Emi Sakakura, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 11/972,200

(22) Filed: Jan. 10, 2008

(65) Prior Publication Data

US 2008/0176425 A1    Jul. 24, 2008

(30) Foreign Application Priority Data

Jan. 24, 2007   (JP)   ............... 2007-013410

(51) Int. Cl.
*H01R 4/64* (2006.01)
(52) U.S. Cl. .................. 439/206; 439/936
(58) Field of Classification Search .......... 439/206, 439/275, 276, 587, 901, 936

See application file for complete search history.

(56) References Cited

U.S. PATENT DOCUMENTS 6,364,692 B1 * 4/2002 Okayasu et al. ............ 439/426
6,835,090 B1 * 12/2004 Liedtke ..................... 439/521
6,953,286 B2 * 10/2005 Jeong et al. ................. 385/78
7,201,592 B2 * 4/2007 Hata ......................... 439/206
7,217,157 B2 * 5/2007 Onoda et al. ............... 439/589

FOREIGN PATENT DOCUMENTS

JP        2000-150027        5/2000

* cited by examiner

*Primary Examiner*—Hien Vu
(74) *Attorney, Agent, or Firm*—Gerald E. Hespos; Anthony J. Casella

(57) ABSTRACT

A housing (60) has two side walls (67) and a covering wall (66) that define a U-shaped channel for covering terminal fittings (20). The housing (60) is mounted on a printed-circuit board (90) so that the U-shaped channel and the circuit board (90) define a bag-shaped space (70). The U-shaped channel of the housing (60) and the circuit board (90) are accommodated in a case (30) so that the bag-shaped space (70) faces down. A potting material (40) then is introduced into the case (30). Air vents (73) are formed through the covering wall (66) and provide communication between the bag-shaped space (70) and an outer surface of the covering wall (66). Thus, air trapped in the bag-shaped space (70) is discharged to the outside through the air vents (73).

11 Claims, 5 Drawing Sheets

CONNECTOR FOR USE IN SUBSTRATE

BACKGROUND OF THE INVENTION

1. Field of the Invention

The invention relates to a connector for use on a substrate and a method of assembling the connector for use in the substrate.

2. Description of the Related Art

Japanese Patent Application Laid-Open No. 2000-150027 discloses a connector for use on a substrate. The connector has a housing placed on a printed-circuit board and terminal fittings are mounted in the housing. A covering wall and left and right side walls project from the rear of the housing and form a U-shape in a rear view. The terminal fittings are drawn out from the rear of the housing and are bent midway to define an L-shape. The end of the bent portion of each terminal fitting is connected electrically with a conductive path of the printed-circuit board. A rearwardly open bag-shaped space is defined by the covering wall, the side walls, and the printed-circuit board.

The housing can be placed on the printed-circuit board inside a case and a potting material can be charged into the case to make the connector waterproof. In this case, the bag-shaped space is open downward. Thus, air likely to be trapped in the bag-shaped space as the potting material is being introduced. It is not easy to release the air that has been trapped inside bag-shaped space and there is a fear that the potting material will harden with the air trapped in the bag-shaped space. As a result, the area of contact between the housing and the potting material is insufficient and a desired adhesion strength cannot be maintained. Consequently the potting material can separate from the housing and there is a fear that the housing will not be sufficiently waterproof.

The invention has been completed in view of the above-described situation. Therefore it is an object of the invention to prevent air from being trapping so that connector is sufficiently waterproof.

SUMMARY OF THE INVENTION

The invention relates to a connector for use on a substrate. The connector has a housing placed on a printed-circuit board. Terminal fittings are mounted in the housing and are connected respectively with conductive paths of the printed-circuit board. A covering wall and side walls project rearward from the rear of the housing. The side walls are continuous with side edges of the covering wall so that wall surfaces of the side walls intersect a wall surface of the covering wall. Thus, a rearwardly-open bag-shaped space is surrounded by the covering wall, the side walls, and the printed-circuit board to define a blind alley. The housing is accommodated in a case so that a front portion of the housing is disposed outside beyond an open front of the case and so that a rear portion of the housing, including the bag-shaped space, is covered with a sealing material introduced into the case. At least one air vent is formed through the covering wall to provide communication between the bag-shaped space and an outer surface of the covering wall.

There is a fear that air will be trapped in the bag-shaped space as the sealing material is introduced. However, air in the bag-shaped space of the blind alley will be discharged to the outside through the air vent in the covering wall. The absence of air in the bag-shaped space of the blind alley ensures a large contact area between the housing and the potting material. Therefore, a required adhesion is assured and the connector is waterproof.

A substrate-fixing portion preferably projects out from the side walls to be fixed to the printed-circuit board. A fixing hole is formed through the substrate-fixing portion for receiving a fixing member. The fixing member extends parallel to their air vent. The alignment of the fixing hole parallel to the air vent enables the die-cutting direction of the air vent and the fixing hole to be coincident with each other. Consequently, both holes can be molded at one time by one molding material. Thus it is possible to simplify the molding material and easily from the air vent.

The air vent preferably is a small hole disposed near a rear surface of the body of the housing. The disposition of the air vent near the rear of the body assures a secure discharge of air trapped between the body of the housing and the covering wall to the outside. Further, the small size of the air vent ensures a necessary strength for the covering wall.

The invention also relates to a method of assembling a connector for use with a substrate. The method includes placing the housing on the printed-circuit board and inside a case with the open surface of the case facing up and with a front surface of the housing facing up. The method proceeds by charging a sealing material into a bag-shaped space of the case and removing air in the bag-shaped space through an air vent by drawing a vacuum on the case. The vacuum drawing ensures a secure discharge of the air trapped inside the bag-shaped space to the outside.

DETAILED DESCRIPTION OF THE PREFERRED EMBODIMENTS

Figure 1:
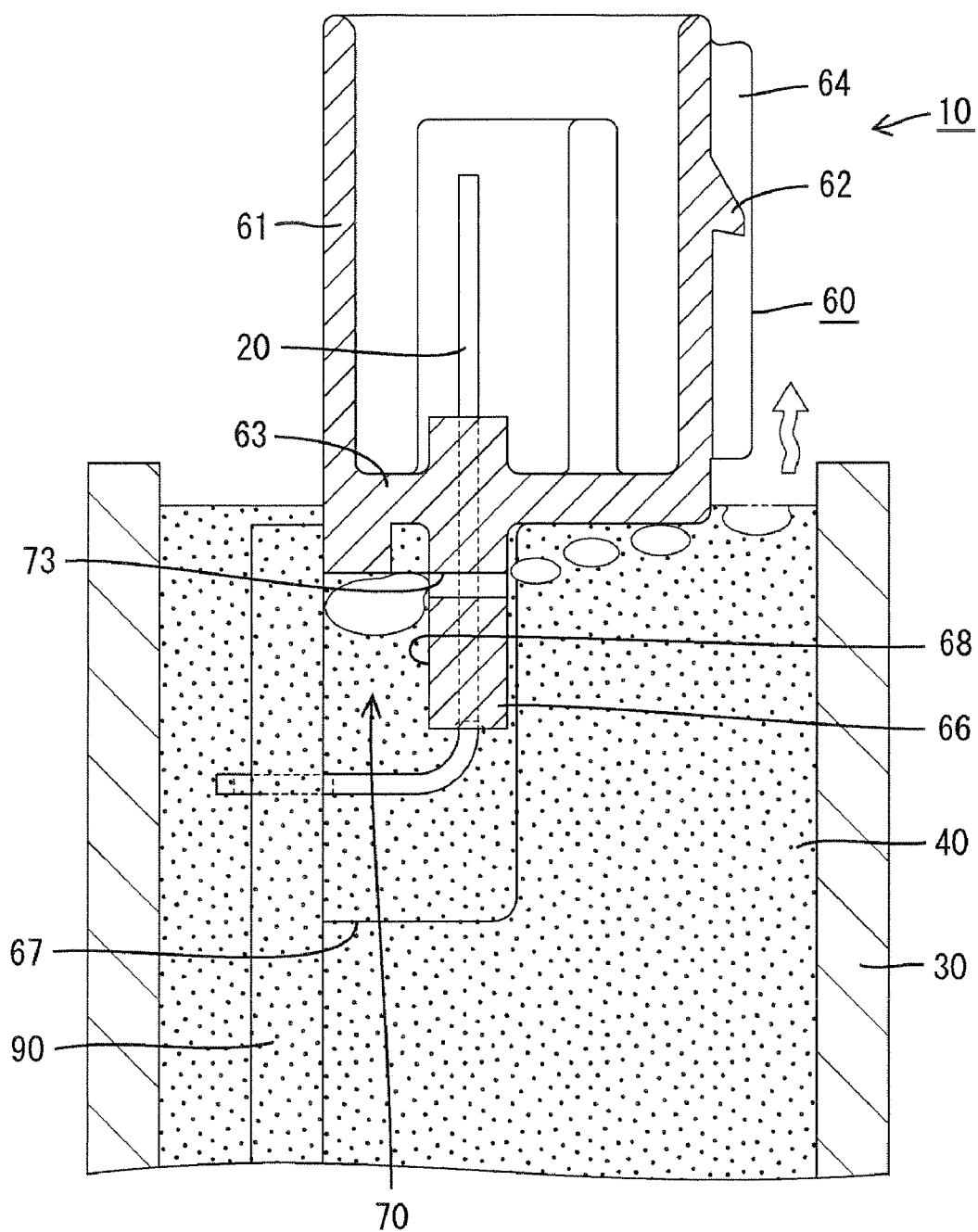
FIG. 1 is a sectional view of an assembled connector in accordance with the invention for use on a substrate.

A connector in accordance with the invention is identified generally by the numeral 10 in FIGS. 1 through 5. The connector 10 is intended for use on a substrate and has a terminal fitting 20 and a housing 60 to which the terminal fitting 20 is mounted. The housing 60 can be connected to a mating housing (not shown). The housing 60 can be placed on a printed-circuit board 90 and both the housing 60 and the printed-circuit board 90 can be accommodated inside a case 30. A potting material 40 is introduced into the case 30 to provide a liquid-tight sealing in the case 30. In the description made below, the fit-on side of both housings is referred to as the front.

Figure 2:
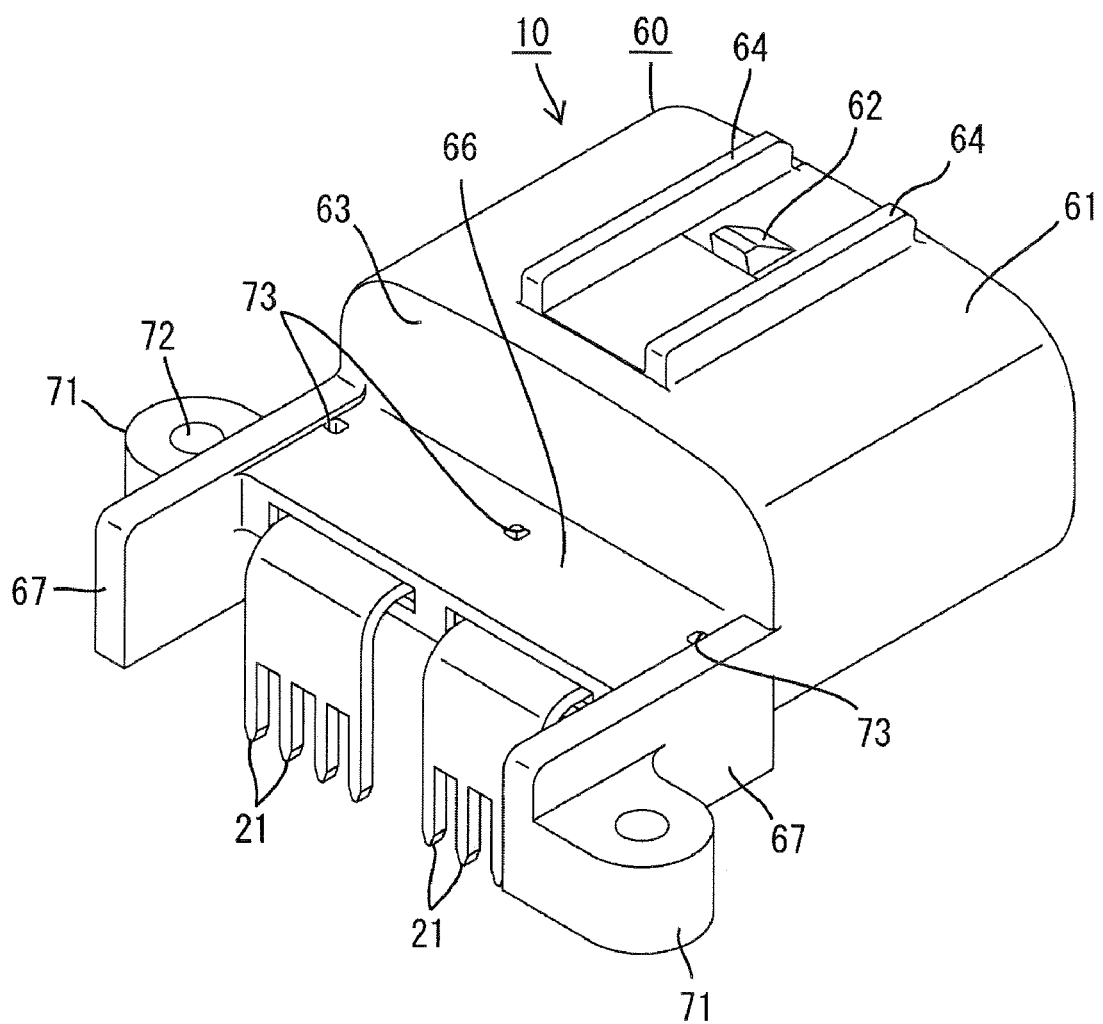
FIG. 2 is a perspective view showing the connector as viewed obliquely from an upper rear position.
Figure 3:
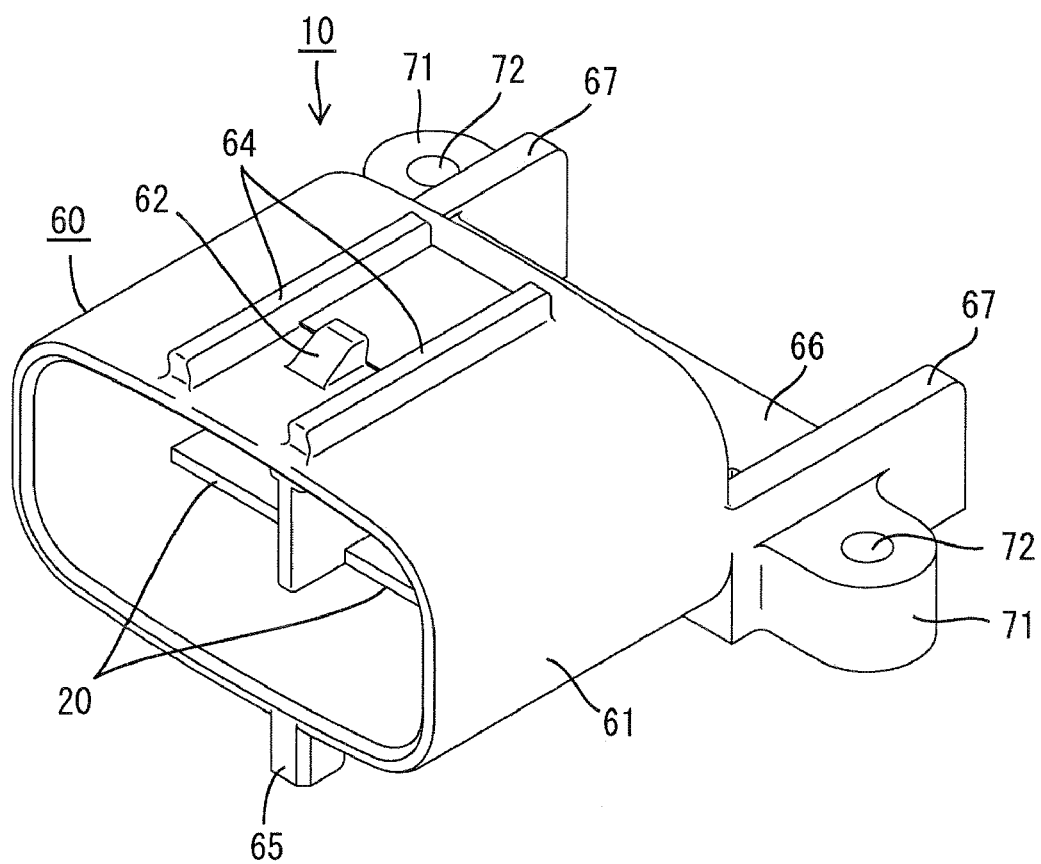
FIG. 3 is a perspective view showing the connector as viewed obliquely from an upper front position.

The housing 60 is made of synthetic resin, and has a wide tubular hood 61 that projects forward from a rear wall 63, as shown in FIGS. 2 and 3. Two side-by-side terminal fittings 20 are press fit into the rear wall 63 of the hood 61. Each terminal fitting 20 is formed from a wide plate-shaped band and is bent approximately perpendicularly midway along its length to define an L-shape in a side view. A front portion of the terminal fitting 20 projects into the hood 61 so that the terminal fitting 20 can be connected with a mating terminal fitting mounted in a mating housing. A rear portion of the terminal fitting 20 is fork-shaped, with four branched portions 21 that are connected electrically with corresponding conductive paths on the printed-circuit board 90.

A lock 62 projects from an upper peripheral surface of the hold 61 for locking the mating housing in a fit-in state. The guide walls 64 extend longitudinally on opposite sides of the lock 62. A rib 65 projects from the lower peripheral surface of the hood 61 at a position near one side with respect to the widthwise center for preventing the housing 60 from being fit erroneously on the mating housing.

A covering wall 66 projects rearward from a rear surface of a rear wall 63 of the hood 61. The covering wall 66 is a wide rectangle in plan view and extends horizontally across almost the entire width of the hood 61. The covering wall 66 covers a rear part of each terminal fitting 20 continuously from the rear wall 63 of the hood 61 to a position near the rear end of the horizontal leg of the terminal fitting 20. The terminal fitting 20 is bent perpendicularly down to the printed-circuit board 90 at a position slightly rearward from the rear end of the covering wall 66.

Two side walls 67 project almost perpendicularly rearward from the widthwise edges of the rear surface of the rear wall 63 of the hood 61 and are continuous with the opposite sides of the covering wall 66. Opposed facing surfaces of the side walls 67 extend orthogonally from a wall surface of the covering wall 66. In a side view, each side wall 67 is a rectangle that is long in the longitudinal direction of the housing 60. Rear ends of the side walls 67 are rearward from the rear end of the covering wall 66 so that the side walls 67 protect portions of the terminal fitting 20 exposed to the outside rearward of the covering wall 66.

A rearwardly-open blind alley 68 is defined by the covering wall 66, both side walls 67 and the printed-circuit board 90 at positions rearward of the rear wall 63 of the hood 61. The blind alley 68 defines a bag-shaped space 70 that is open rearwardly. However, the front of the bag-shaped space 70 is closed by the rear wall 63 of the hood 61, and the sides of the bag-shaped space 70 are closed by the side walls 67, the covering wall 66, and the printed-circuit board 90.

Figure 4:
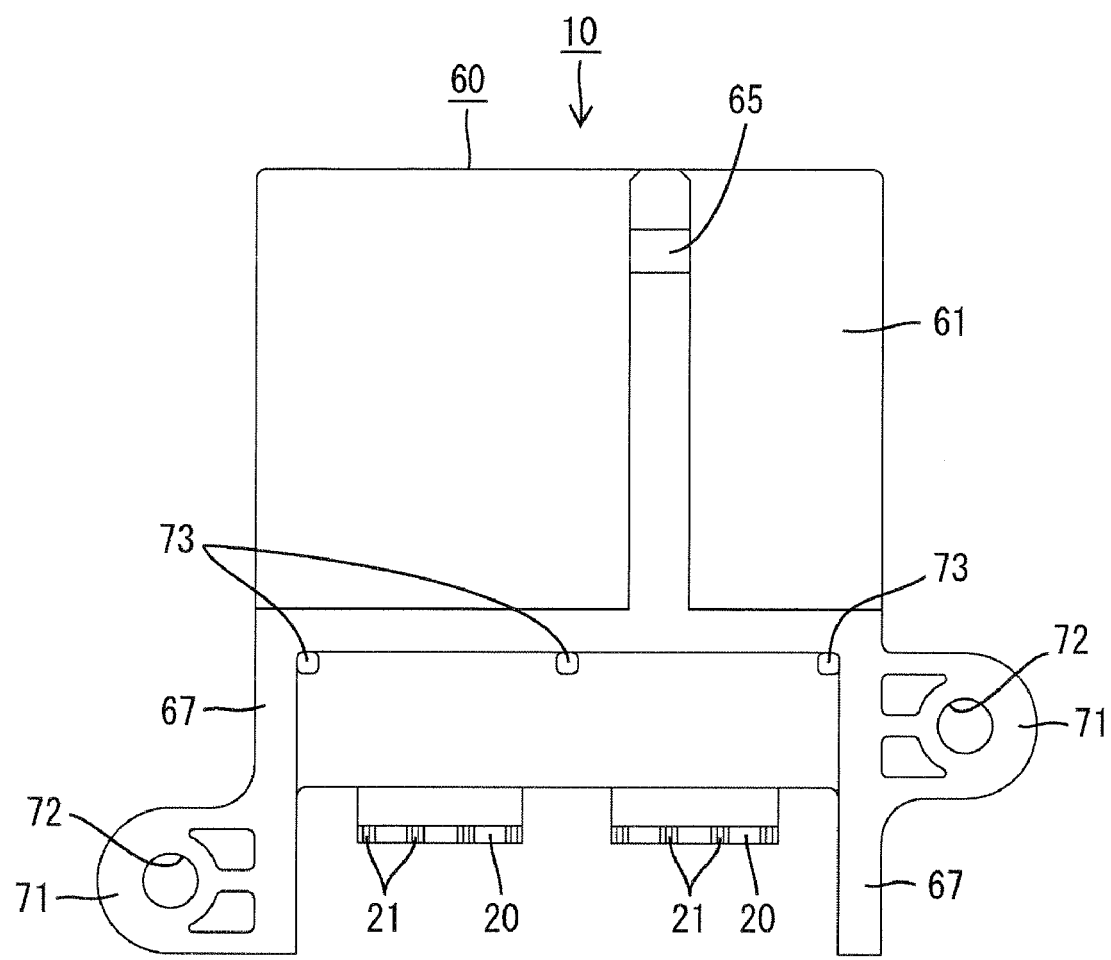
FIG. 4 is a bottom view of the connector.

Substrate-fixing portions 71 project out from outer surfaces of the side walls 67. As shown in FIG. 4, longitudinal positions of the substrate-fixing portions 71 are different from each other. Thus, adjacent substrate-fixing portions 71 are offset longitudinally when plural housings 60 are arranged widthwise. As a result, the adjacent housings 60 are disposed at short intervals to save space. A fixing hole 72 is formed vertically through each substrate-fixing portion 71 and can receive a fixing member (not shown), such as a tapping screw. The fixing member can be inserted from below through a hole (not shown) formed through the printed-circuit board 90 and screwed into the fixing hole 72 for fixing the housing 60 to the printed-circuit board 90.

Figure 5:
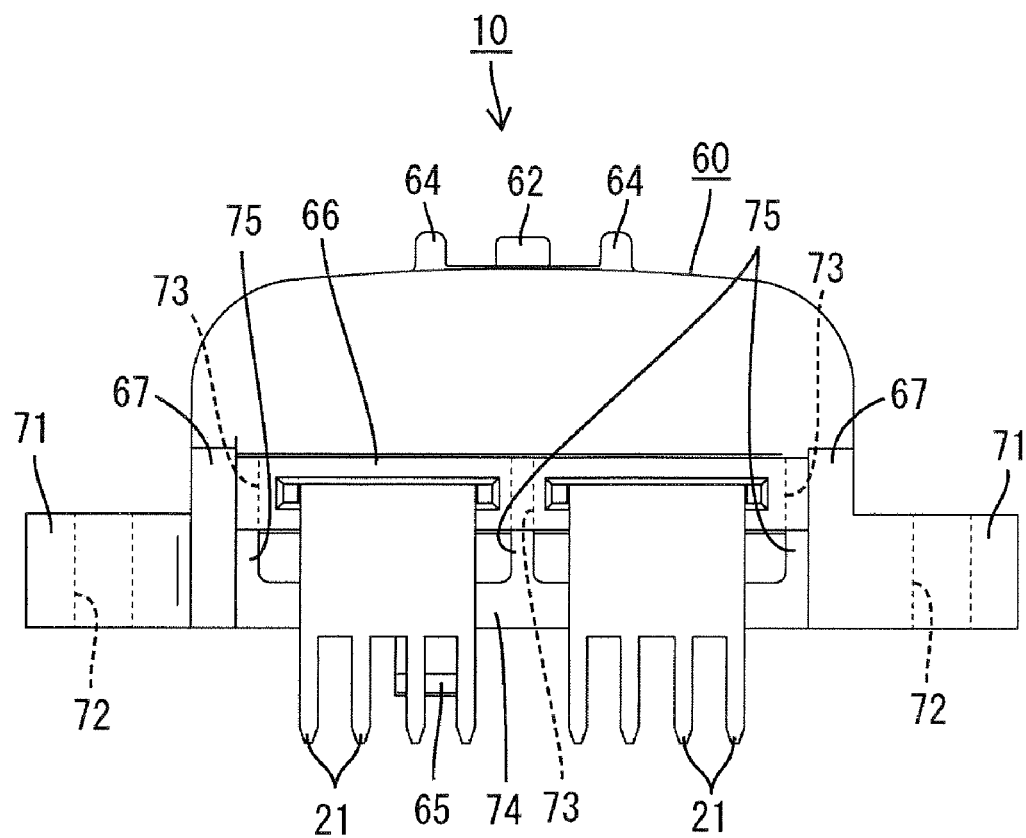
FIG. 5 is a rear view of the connector.

Small circular air vents 73 are formed through the covering wall 66 at positions near the rear surface of the rear wall 63 of the hood 61 and offset from the terminal fittings 20. The air vents 73 permit a release of air that becomes trapped in the bag-shaped space 70 as the potting material 40 is introduced into the case 30. More specifically, the air vents 73 are formed vertically through the covering wall 66 in the height direction so that the bag-shaped space 70 communicates with the outer surface of the covering wall 66. One air vent 73 is formed through a widthwise middle position of the covering wall 66 and between the terminal fittings 20. The other two air vents 73 are disposed laterally outward from the terminal fittings 20 and substantially adjacent the inner surfaces of the side walls 67. As shown in FIG. 5, a transverse rib 74 and three vertical ribs 75 are provided on the rear surface of the rear wall 63 of the hood 61 and face into the bag-shaped space 70. The hole surfaces of the air vents 73 are continuous and flush with the rear projected end surfaces of the vertical ribs 75 with no differences in height between the hole surfaces and the projected end surfaces of the vertical ribs 75. Similar to the fixing holes 72 of the substrate-fixing portions 71, the air vents 73 vertically penetrate the covering wall 66 and extend parallel to the fixing holes 72.

The connector 10 is assembled by placing the housing 60 on the printed-circuit board 90 and then soldering the branched portions 21 of the terminal fittings 20 into connection with the corresponding conductive paths. The fixing members then are screwed into the substrate-fixing portion 21, and the printed-circuit board 90 on which the housing 60 has been mounted is fixed to the inside of the case 30. In this assembled condition, the hood 61 projects up in an exposed state beyond the open surface of the case 30. However, the covering wall 66 and both side walls 67 are accommodated in the case 30. In this state, the blind alley portion 68 is entirely accommodated inside the case 30, and the bag-shaped space 70 is open down towards the bottom of the case 30.

The case 30 is stood upright with the open surface thereof facing up. The potting material 40 then is charged into the case 30 from the open upper end thereof. A sufficient insertion of the potting material 40 into the case 30 brings the liquid surface of the potting material 40 to a level near the level of the open surface of the case 30. As a result, the potting material 40 penetrates into the bag-shaped space 70 of the blind alley 68 and may cause air to be trapped, as shown by ellipses in FIG. 1.

After the potting material 40 is introduced into the case 30, a vacuum is drawn on the inside of the case 30 by using a vacuum source (not shown), such as a compressor. The vacuum forcibly moves air in the bag-shaped space 70 to the outer surface of the covering wall 66 along the air vents 73. The air moved to the outer surface of the covering wall 66 rises to the liquid surface of the potting material 40 due to its buoyant force and is discharged upward to the outside. The vacuum drawing continues until all of the air inside the bag-shaped space 70 is discharged. The conductive path of the printed-circuit board 90 and the terminal fitting 20 are sealed when the potting material 40 hardens and the connector 10 is available for use in the substrate on which the case 30 is mounted. Thereafter the mating housing is fit in the hood 61 from the front end of the connector 10 to connect the terminal fitting 20 with the mating terminal fitting mounted in the mating housing.

The bag-shaped space 70 in the housing 60 is likely to trap air as the potting material 40 is introduced into the case 30. However, the air vents 73 are formed through the covering wall 66 at the three positions, including the widthwise middle position spaced from the side walls 67. Thus air can be discharged through the air vents 73 from the bag-shaped space 70 of the blind alley 68 to the outside. Consequently it is possible to prevent air from being trapped in the bag-shaped space 70 of the blind alley 68 and an acceptable area of contact between the housing 60 and the potting material 40 can be achieved. Therefore it is possible to keep the predetermined adhesion strength and to obtain the required waterproofing.

The air vents 73 are aligned parallel to the fixing holes 72 of the substrate-fixing portions 71. Thus in molding the housing 60, it is possible to make the die-cutting directions of the air vents 73 and the fixing holes 72 coincident with each other. Consequently it is possible to mold both holes 72, 73 at the same time by using one molding material. Thus it is possible to simplify the molding material and easily form the air vents.

Air inside the bag-shaped space 70 goes up through the potting material 40 due to its buoyancy and moves towards the rear surface of the rear wall 63 of the hood 61. The air vents 73 are near the rear surface of the rear wall 63 of the hood 61. Thus, it is easy to move air in the bag-shaped space 70 to the entrances of the air vents 73 and to the outside. Further, the air vents 73 are small holes, and a necessary strength of the covering wall 66 is achieved more easily than an air vent defined by a large hole.

Furthermore, vacuum drawing can be used for discharging to the outside any air trapped inside the bag-shaped space 70.

The invention is not limited to the above-described embodiment. For example, the following embodiments are included in the technical scope of the invention.

The air vent may be formed as a cut-out groove open at the rear end of the covering wall.

The connector may be constructed so that the air trapped inside the bag-shaped space is discharged to the outside through the air vent portion by imparting vibration to the case.

The air vent may be sloped from the bag-shaped space to the outer surface of the covering wall. This construction allows the air to go up obliquely through the air vent and to be discharged easily to the outside.

The air vent may be formed on the covering wall at two positions or at least four positions, provided that the air vents do not interfere with the terminal fittings.

The body of the housing may be block-shaped and may have a construction where female terminal fittings are mounted.

What is claimed is:

1. A connector for use on a substrate, comprising:
   a housing having a rear wall and a hood projecting forwardly from the rear wall, the housing being placed on a printed-circuit board;
   terminal fittings mounted in the housing and connected respectively with conductive paths of the printed-circuit board;
   a covering wall projected rearward from a rear wall of the housing and covering the terminal fittings;
   two side walls projected rearward from the rear wall of the housing and being continuous with opposite widthwise sides of the covering wall, wall surfaces of the side walls intersecting a wall surface of said covering wall;
   a rearwardly open bag-shaped space being formed by the covering wall the side walls and the printed-circuit board;
   the rear wall of the housing and the printed-circuit board being accommodated in a case with a front portion of the housing disposed beyond an open surface of the case and with a rear portion thereof, including the bag-shaped space covered with a potting material introduced into substantially the entire interior of the case; and
   at least one air vent formed through the covering wall for communicating the bag-shaped space with an outer surface of the covering wall.

2. The connector of claim 1, wherein the at least one air vent comprises a plurality of air vents.

3. The connector of claim 2, wherein one of the air vents is substantially at a middle position spaced from said side walls.

4. The connector of claim 1, further comprising substrate-fixing portions, projecting out from the side walls, a fixing hole being formed through each of the substrate-fixing portions for receiving a fixing member, the fixing holes being parallel to the air vent.

5. The connector of claim 4, wherein the air vent is substantially adjacent the rear wall of said housing.

6. A connector comprising a housing, mounted on a printed-circuit board having opposite front and rear ends, a forwardly open hood at the front end of the housing, a rear wall extending transversely across the hood between the front and rear ends of the housing, a U-shaped channel extending rearwardly from the rear wall, and at a lower portion thereof, the U-shaped channel being defined by opposed side walls extending from the rear wall towards the rear end of the housing and a covering wall connecting the side walls, at least one air vent extending through the covering wall, the rear wall and the printed-circuit board being accommodated in a case, terminal fittings extending through the rear wall, rear ends of the terminal fittings being partly surrounded by the U-shaped channel, the air vent being offset from the terminal fittings.

7. The connector of claim 6, further comprising substrate-fixing portions, projecting laterally outward from the side walls, fixing holes, extending through the substrate fixing portions and being parallel to the air vent.

8. The connector of claim 6, wherein the air vent is substantially adjacent the rear wall.

9. The connector of claim 8, wherein the at least one air vent comprises a plurality of air vents.

10. The connector of claim 9, wherein at least one of the air vents is substantially adjacent one of the side walls.

11. The connection of claim 10, wherein at least one of the air vents is spaced from the side walls.

* * * * *